(12) United States Patent
Hirose

(10) Patent No.: US 9,035,273 B2
(45) Date of Patent: May 19, 2015

(54) RESISTIVE SWITCHING MEMORY DEVICE

(75) Inventor: Sakyo Hirose, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 13/323,927

(22) Filed: Dec. 13, 2011

(65) Prior Publication Data

US 2012/0132883 A1  May 31, 2012

Related U.S. Application Data

(63) Continuation of application No. PCT/JP2010/060019, filed on Jun. 14, 2010.

(30) Foreign Application Priority Data

Jun. 15, 2009 (JP) .................................. 2009-142193

(51) Int. Cl.
| | |
|---|---|
| H01L 47/00 | (2006.01) |
| H01L 29/861 | (2006.01) |
| H01L 27/10 | (2006.01) |
| H01L 29/24 | (2006.01) |
| H01L 29/47 | (2006.01) |
| H01L 45/00 | (2006.01) |

(52) U.S. Cl.
CPC .......... *H01L 29/8615* (2013.01); *H01L 27/101* (2013.01); *H01L 29/24* (2013.01); *H01L 29/47* (2013.01); *H01L 45/085* (2013.01); *H01L 45/1226* (2013.01); *H01L 45/147* (2013.01)

(58) Field of Classification Search
CPC .............................. H01L 45/1206; H01L 45/04
USPC ............... 257/E45.002, E35.003, E27.004, 4, 257/536, 44, 310, E29.325
See application file for complete search history.

(56) References Cited

U.S. PATENT DOCUMENTS

| | | | |
|---|---|---|---|
| 7,009,278 B2 * | 3/2006 | Hsu ................................ | 257/536 |
| 2003/0107300 A1 | 6/2003 | Nakamura et al. | |
| 2006/0081962 A1 * | 4/2006 | Wei et al. ....................... | 257/537 |
| 2007/0228893 A1 | 10/2007 | Yamauchi et al. | |
| 2009/0065757 A1 | 3/2009 | Sawa et al. | |
| 2009/0289251 A1 | 11/2009 | Kiyotoshi | |
| 2012/0057730 A1 | 3/2012 | Fujise et al. | |

FOREIGN PATENT DOCUMENTS

| | | |
|---|---|---|
| CN | 1413002 A | 4/2003 |
| CN | 101099410 A | 1/2008 |

(Continued)

OTHER PUBLICATIONS

Choi et al., Bipolar resistance switching characteristics in a thin Ti—Ni—O compound film, Apr. 3, 2009, Nanotechnology, 20 175704.*

(Continued)

*Primary Examiner* — Dale E Page
(74) *Attorney, Agent, or Firm* — Arent Fox LLP

(57) ABSTRACT

A resistive switching memory device is provided with first to third electrodes. The first electrode forms a Schottky barrier which can develop a rectifying property and resistance change characteristics at an interface between the first electrode and an oxide semiconductor. The third electrode is made of a material which provides an ohmic contact with the oxide semiconductor. A control voltage is applied between the first and second electrodes, and a driving voltage is applied between the first and third electrodes.

10 Claims, 7 Drawing Sheets

(56) References Cited

FOREIGN PATENT DOCUMENTS

| JO | 2010-080490 | 4/2010 |
|---|---|---|
| JP | 2000-236100 | 8/2000 |
| JP | 2006-120702 | 5/2006 |
| JP | 2009-283680 | 12/2009 |
| JP | 2009-295941 | 12/2009 |
| WO | WO 2006/101152 | 9/2006 |
| WO | WO-2010/137242 A1 | 12/2010 |

OTHER PUBLICATIONS

Matsumoto et al., Chemical trend of Fermi-level shift in transition metal-doped TiO2 films, 2010, Journal of the Ceramic Society of Japan, 118, 993-996.*

Odagawa et al., Colossal Electroresitance of a Pr0.7Ca0.3MnO3 thin film at route temperature, Physical Review B 70, 22403, The American Physical Society 2004.

Fujii, et al. Electrical properties and colossal electroresistance of heteropitaxial $SrRUO_3/SrTl_{1-x}Nb_xO_3$ ($0.0002 \leq x \leq 0.02$) Schottky junctions; Physical Review B 75, 165101 The American Physical Society (2007).

Fuji et al. Hysteretic current-voltage characteristics and resistance switching at an epitaxial oxide Schottky junction SrRuO3/SrTi0.99Nb0.01O3, Applied Physics Letter 86, 012107 (2005).

Hirose et al. Resistance switching and retention behaviors in polycrystalline La-doped SrTiO3 ceramics chip devices, J Appl. Physics, 104, 053712 (2008).

PCT/JP2010/060019 Copy of Written Opinion dated Sep. 14, 2010.

* cited by examiner

RESISTIVE SWITCHING MEMORY DEVICE

CROSS REFERENCE TO RELATED APPLICATIONS

The present application is a continuation of International application No. PCT/JP2010/060019, filed Jun. 14, 2010, which claims priority to Japanese Patent Application No. 2009-142193, filed Jun. 15, 2009, the entire contents of each of which are incorporated herein by reference.

FIELD OF THE INVENTION

The present invention relates to a resistive switching memory device which can undergo a change in resistance value through application of a voltage, and store the change, and more particularly, relates to a resistive switching memory device including an oxide semiconductor.

BACKGROUND OF THE INVENTION

It is known that oxide semiconductors of specific compositions can provide resistive memory characteristics. More specifically, to explain the property of the oxide semiconductor, the oxide semiconductor exhibits, for example, a relatively high resistance in the initial condition between a pair of electrodes in contact with the oxide semiconductor. However, when a voltage of not less than a predetermined value is applied, the resistance is changed to a low resistance state, and this low resistance state is held (stored) even when the voltage is eliminated. On the other hand, in the case of the low resistance state, when a voltage of not less than a predetermined value is applied in the reverse direction between the pair of electrodes, the resistance is returned to the high resistance state, and the high resistance state is held (stored) even when the voltage is eliminated.

This type of oxide semiconductor can be switched between a low resistance state and a high resistance state by applying a voltage of not less than a threshold value in each of a forward direction and a reverse direction between a pair of electrodes, and this switching allows the resistance to be changed and stored. The use of the resistive switching characteristics allows the resistive switching memory devices to be used not only as resistive memory elements but also as switching elements.

The oxide semiconductors as described above are disclosed in, for example, Non-Patent Documents 1 and 2. Non-Patent Document 1 discloses a device including an n-type semiconductor and an electrode which forms a Schottky barrier, which develops a rectifying property and substantial hysteresis in current-voltage characteristics. Non-Patent Document 2 discloses a device which has a capacitor structure including p-type $Pr_{0.7}Ca_{0.3}MnO_3$ and an Ag or Pt electrode, and provides resistive switching characteristics.

Besides Non-Patent Documents 1 and 2 described above, a large number of resistive switching memory devices each including an oxide semiconductor have been proposed, which are broadly divided into the resistive switching memory devices for developing the characteristics as described above, derived from the interface between the oxide semiconductor and an electrode (interface type or Schottky type), and derived from the bulk of the oxide semiconductor (bulk type or filament type).

In the case of constituting a resistive switching memory device with the use of the oxide semiconductor, a structure is typically adopted as shown in FIG. 14.

Referring to FIG. 14, a resistive switching memory device 1 includes an oxide semiconductor 2, and at least a pair of electrodes 3 and 4 opposed to each other with at least a portion of the oxide semiconductor 2 interposed therebetween. In this embodiment, the resistive switching memory device 1 has a capacitor structure with the lower electrode 4 formed on an insulating substrate 5, the thin-film oxide semiconductor 2 formed thereon, and further the thin-film upper electrode 3 formed thereon.

This resistive switching memory device 1 is of, for example, the interface type or Schottky type described above, in which at least one of the electrodes 3 and 4 is made of a material which can form a Schottky barrier which can develop a rectifying property and resistance change characteristics in an interface region between the electrode and the oxide semiconductor 2. The Schottky barrier has not only a rectifying property but also substantial hysteresis in the current-voltage characteristics, and the resistance state such as a high resistance state or a low resistance state can be changed by varying the polarity of the voltage applied between the electrodes 3 and 4.

To explain more specifically, for example, when the electrode 3 is assumed to form a Schottky barrier in an interface region between the electrode 3 and the oxide semiconductor 2, the interface region between the electrode 3 and the oxide semiconductor 2 is turned into a lower resistance in the case of applying a control voltage in a first direction between the pair of electrodes 3 and 4 through a pair of terminals 6 and 7, and then, this low resistance state is held even in the case of removing the control voltage in the first direction. On the other hand, in the case of applying a control voltage in a second direction opposite to the first direction between the pair of electrodes 3 and 4 through the pair of terminals 6 and 7, the interface region between the electrode 3 and the oxide semiconductor 2 is turned into a higher resistance, and then, this high resistance state is held even in the case of removing the control voltage in the second direction.

When not only a memory application but also an application as a resistive switch or impedance switch which has a memory function are considered as uses of the resistive switching memory device 1, the application of the control voltage described above is essential to change the resistance state. In particular, in the case of the resistive switching memory device 1 derived from a Schottky barrier, it is expected that new devices can be achieved by adding the resistance change and memory characteristics to p-n junction devices, diodes, and the like, currently in common use.

In the case of common diodes and p-n junction devices, the resistance value of the device can be changed substantially with a voltage applied, and the resistance value is reversed when the voltage is removed. Thus, the devices have no particular adverse effects as long as the devices each have two terminals in the same way as common resistors.

In contrast, in the case of the resistive switching memory device 1, it is possible to hold the resistance state thereof even when the voltage is removed. Thus, there is a need to change the resistance state by applying any voltage (control voltage), and then apply a voltage (driving voltage) for applying a current or a signal. In this case, there is a need to apply both the control voltage for switching the resistance state and the driving voltage for applying a current or a signal through the common terminals 6 and 7 in the resistive switching memory device 1 which has only the two terminals of the terminals 6 and 7 as shown in FIG. 14.

Therefore, in the case of applying the control voltage for changing the resistance state between the terminals 6 and 7, there is a need to temporarily disconnect the terminals 6 and 7 from the current line or the signal line with the use of a switch or the like, and the control of the resistive switching memory device 1 thus becomes complicated.

In addition, the resistive switching memory device 1 develops the resistive switching characteristics, and the rate of resistance change or the resistance value has a voltage dependence. Depending on the applied voltage, problems may be encountered, such as an excessively high or low resistance value, or an excessively low rate of resistance change.

In order to solve the problems as described above, it is desired to make it possible to control the resistance state independently.

Non-Patent Document 1: T. Fujii, and five others, "Hysteretic current-voltage characteristics and resistance switching at an epitaxial oxide Schottky Junction SrRuO3/SrTi0.99Nb0.0103", APPLIED PHYSICS LETTERS 86, 012107 (2005)

Non-Patent Document 2: A. Odagawa, and five others, "Colossal electroresistance of a Pr0.7Ca0.3MnO3 thin film at room temperature", PHYSICAL REVIEW B 70, 224403 (2004)

SUMMARY OF THE INVENTION

Therefore, an object of the present invention is to provide a resistive switching memory device which can satisfy the demand as described above.

A resistive switching memory device according to the present invention includes an oxide semiconductor, and electrodes provided in contact with the oxide semiconductor, and includes, in short, at least three electrodes such as first, second, and third electrodes, as the electrodes in order to solve the problems described above.

The first electrode is made of a material which can form a Schottky barrier which can develop a rectifying property and resistance change characteristics in an interface region between the first electrode and the oxide semiconductor. In addition, the third electrode is made of a material which provides more ohmic contact with the oxide semiconductor as compared with the first and second electrodes.

Furthermore, the resistive switching memory device according to the present invention further includes a power supply for control for controlling the resistance of the interface region, which is connected between the first electrode and the second electrode.

It is to be noted that the term "interface region" mentioned above is not limited to the interface between the oxide semiconductor and the electrode, and used to refer to also include the vicinity of the interface.

In the present invention, while the second electrode is preferably made of a material which can form a Schottky barrier which can develop a rectifying property and resistance change characteristics in an interface region between the second electrode and the oxide semiconductor, an insulating layer may be formed instead along the interface between the second electrode and the oxide semiconductor.

The oxide semiconductor is preferably an n-type semiconductor. In this case, as the oxide semiconductor, in particular, an oxide semiconductor is advantageously used, which has a composition represented by the general formula: $(Ba_{1-x}Sr_x)Ti_{1-y}M_yO_3$ (M is at least one of Mn, Fe, and Co; $0 \le x \le 1.0$ and $0.005 \le y \le 0.05$), or has a composition represented by the general formula: $Ti_{1-x}M_xO_2$ (M is at least one of Fe, Co, Ni, and Cu; $0.005 \times 0.05$).

According to the present invention, the resistive switching memory device includes at least three electrodes such as first, second, and third electrodes, and a driving voltage for applying a current or a signal is applied to the first and third electrodes. However, the resistance state can be controlled independently from the application of the driving voltage, in such a way that a control voltage for controlling the resistance is applied to the first and second electrodes from the power supply for control. Therefore, in the case of applying a control voltage for changing the resistance state, control complications can be eliminated, such as disconnection from the current line or signal line temporarily with the use of a switch or the like.

In addition, the control voltage applied between the first and second electrodes is also allowed to function to adjust the rate of resistance change or resistance value of the resistive switching memory device. Therefore, the resistive switching memory device can achieve a desired rate of resistance change easily, and achieve a desired resistance value easily.

Furthermore, in the resistive switching memory device according to the present invention, the junction interface between the oxide semiconductor and the first electrode entirely develops the phenomenon of resistance change, and it is thus easy to design the resistance value in terms of electrode area. In addition, the interface has high uniformity, and it is thus possible to achieve a stable change in resistance or impedance.

The present invention can make the following problem less likely to be caused, when the second electrode is also made of a material which can form a Schottky barrier which can develop a rectifying property and resistance change characteristics in the interface region between the second electrode and the oxide semiconductor, or when an insulating layer is formed along the interface between the second electrode and the oxide semiconductor. More specifically, when the control voltage is applied between the first and second electrodes, the problem of leakage current that an excessive current can flow between the first and second electrodes, and further depending on the circuit, a current can flow between the second and third electrodes can be caused. However, this problem can be prevented from being caused with more certainty. As a result, the resistive switching memory device according to the present invention can have improved controllability, and an enhanced function of malfunction suppression, and further make a contribution to reduction in power consumption.

In particular, when the second electrode is made of a material which can form a Schottky barrier in the interface region between the second electrode and the oxide semiconductor, as compared with the case of the insulating layer formed, a voltage can be applied more efficiently to the interface region of the first electrode, thus avoiding a decrease in rate of resistance change. In addition, the manufacturing process for the resistive switching memory device can be simplified, because the first electrode and the second electrode can be formed by a common process.

In the present invention, the use of, as the oxide semiconductor, an n-type semiconductor which has a composition represented by the general formula: $(Ba_{1-x}Sr_x)Ti_{1-y}M_yO_3$ (M is at least one of Mn, Fe, and Co; $0 \le x \le 1.0$ and $0.005 \le y \le 0.05$), or has a composition represented by the general formula: $Ti_{1-x}M_xO_2$ (M is at least one of Fe, Co, Ni, and Cu; $0.005 \times 0.05$), can achieve a resistive switching memory device which particularly has a high rate of resistance change, and has an excellent resistive memory effect.

DETAILED DESCRIPTION OF THE INVENTION

Figure 1:
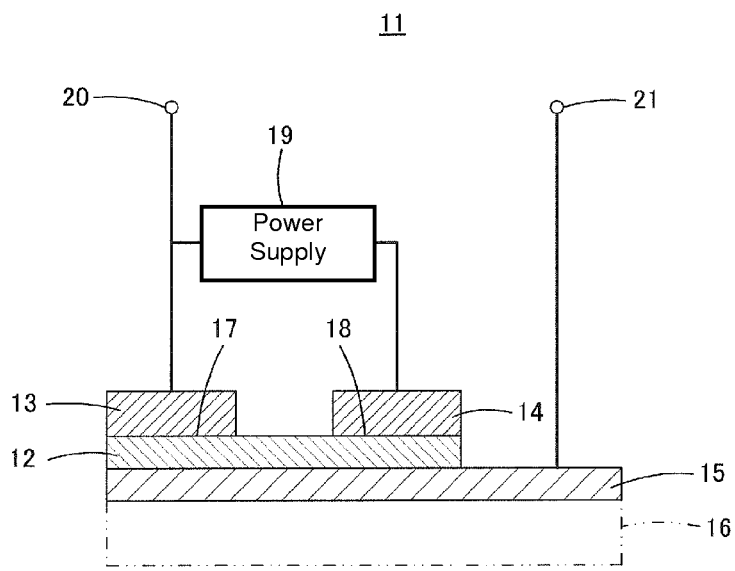
FIG. 1 is a cross-sectional view schematically illustrating a resistive switching memory device according to a first embodiment of the present invention.

Referring to FIG. 1, a resistive switching memory device 11 includes an oxide semiconductor 12, and at least three electrodes including first, second, and third electrodes 13, 14, and 15, which are provided so as to come into contact with the oxide semiconductor 12. In this embodiment, the resistive switching memory device 11 has a capacitor structure with the thin-film oxide semiconductor 12 formed on the third electrode 15, and with the first and second electrodes 13 and 14 further formed thereon so as to be opposed to the third electrode 15 with the oxide semiconductor 12 interposed therebetween.

It is to be noted that while the third electrode 15 itself may function as a substrate, an insulating substrate 16 (indicated by an imaginary line) may be prepared with the third electrode 15 formed thereon, if necessary. Alternatively, the oxide semiconductor 12 may be provided as a bulk body, rather than a thin film.

Among the first to third electrodes 13 to 15, the third electrode 15 is made of a material which provides more ohmic contact with the oxide semiconductor 12, as compared with the other two electrodes 13 and 14.

Figure 2:
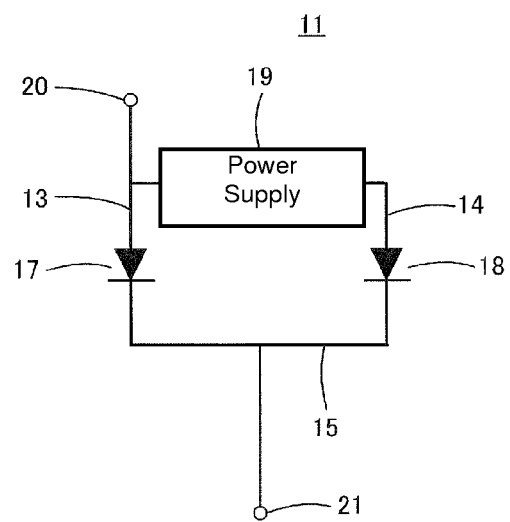
FIG. 2 is a circuit diagram schematically illustrating the resistive switching memory device shown in FIG. 1.

In addition, the first electrode 13 has a work function larger than the work function of the oxide semiconductor 12, which is made of a material which can form a Schottky barrier which can develop a rectifying property and resistance change characteristics at a junction interface 17 between the first electrode 13 and the oxide semiconductor 12. The second electrode 14 is also preferably made of a material which can form a Schottky barrier which can develop a rectifying property and resistance change characteristics at a junction interface 18 between the second electrode 14 and the oxide semiconductor 12. FIG. 2 shows a circuit diagram schematically illustrating the resistive switching memory device 11 in the case of forming a Schottky barrier also at the junction interface 18 between the second electrode 14 and the oxide semiconductor 12. In FIG. 2, the elements corresponding to the elements shown in FIG. 1 are denoted by like reference numerals, for making the correspondence relationship between FIGS. 1 and 2 easy to understand.

A power supply 19 for control is connected between the first electrode 13 and the second electrode 14. This power supply 19 for control is provided to apply, between the first and second electrodes 13 and 14, a control voltage for controlling the resistance value at the interface 17 between the oxide semiconductor 12 and the first electrode 13. The control voltage is applied, if necessary, and intended to adjust the resistance value between the first and third electrodes 13 and 15 or the rate of resistance change to a desired value.

Terminals 20 and 21 are respectively connected to the first and third electrodes 13 and 15. A driving voltage for flowing a current or an electric signal is applied between the first and third electrodes 13 and 15 through these terminals 20 and 21, and the current or electric signal is transmitted between the first and third electrodes 13 and 15.

Specific examples of preferable materials constituting respective elements included for the resistive switching memory devices 11 will be described below.

The oxide semiconductor 12 is preferably an n-type semiconductor. The oxide semiconductor 12 can include, for example, a semiconductor containing $TiO_2$, $SrTiO_3$, $BaTiO_3$, $CaTiO_3$, $(Ba,Sr,Ca)TiO_3$, ZnO, Zn—In—O, Zn—In—Ga—O, $In_2O_3$, or $SnO_2$ as a main constituent.

In addition, as the oxide semiconductor 12, an oxide semiconductor has been recently found to be particularly preferable which has a composition represented by the general formula: $(Ba_{1-x}Sr_x)Ti_{1-y}M_yO_3$ (M is at least one of Mn, Fe, and Co; $0 \leq x \leq 1.0$ and $0.005 \leq y \leq 0.05$), or has a composition represented by the general formula: $Ti_{1-x}M_xO_2$ (M is at least one of Fe, Co, Ni, and Cu; $0.005 \leq x \leq 0.05$).

Preferred materials as the material of the first electrode 13, which are large in work function with respect to the n-type oxide semiconductor 12 as described above for exhibiting metallic conduction, include Pt, Au, Pd, Ag, or Ru, or an alloy thereof, and an oxide such as $RuO_2$ and $SrRuO_3$. Besides the metals and oxides as mentioned above, an organic conductor such as PEDOT:PSS may be adopted, as long as the conductor is large in work function and able to form a Schottky barrier with respect to the oxide semiconductor 12.

As in the case of the third electrode 15, in order to achieve an ohmic contact, an electrode material may be selected which is smaller in work function than the oxide semiconductor 12. However, actually, even when the work function is large, ohmic characteristics can be achieved as long as the difference in work function is small. In addition, even when the work function is extremely large, a nearly ohmic contact may be achieved depending on the manufacturing process, and in this case, the electrode may be selected regardless of the work function.

As the material of the third electrode 15, Nb:SrTiO$_3$ is advantageously used, and in addition to this material, Ti, Al, In, Zn, TiN, a noble metal electrode, and the like can be also used.

As the oxide semiconductor 12, a p-type semiconductor can be also used. For example, such a semiconductor can be used that has a composition represented by the general formula: (R,Ca)MnO$_3$ (R is any of La, Nd, Pr, Sm, Gd, Dy, Ho, and Y). In this case, Al, Ti, or In, for example, can be used as the metal constituting the first electrode 13 which can form a Schottky barrier with respect to the oxide semiconductor 12.

In the case of the resistive switching memory device 11, a Schottky barrier is formed at the interface 17 between the oxide semiconductor 12 and the first electrode 13, this Schottky barrier has not only a rectifying property but also substantial hysteresis in the current-voltage characteristics, and the polarity of the control voltage applied between the first and second electrodes 13 and 14 can be varied to change the resistance state such as a high resistance state and a low resistance state. It is to be noted that the same applies to the interface 18 between the oxide semiconductor 12 and the second electrode 14 in this embodiment.

Figure 3:
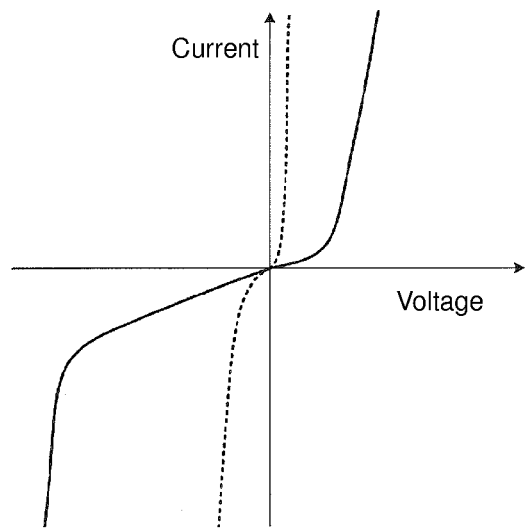
FIG. 3 is a diagram for explaining current-voltage characteristics of the resistive switching memory device shown in FIG. 1.

To explain more specifically, the interface 17 of the first electrode 13 with respect to the oxide semiconductor 12 is assumed to have a high resistance state in the initial condition. In this case, current-voltage characteristics are obtained as indicated by a solid line in FIG. 3, between the first and third electrodes 13 and 15, that is, between the terminals 20 and 21.

Next, when a control voltage of first polarity is applied from the power supply 19 for control between the first and second electrodes 13 and 14, the interface 17 is put into a low resistance state, and this state is also kept after turning off the control voltage. In this case, current-voltage characteristics are obtained as indicated by a dotted line in FIG. 3 between the first and third electrodes 13 and 15, that is, between the terminals 20 and 21.

Next, when a control voltage of second polarity opposite to the first polarity is applied from the power supply 19 for control between the first and second electrodes 13 and 14, the interface 17 is again put into a high resistance state, and this state is also kept after turning off the control voltage. In this case, current-voltage characteristics are obtained as indicated by the solid line in FIG. 3, between the first and third electrodes 13 and 15, that is, between the terminals 20 and 21.

Further, when the control voltage is applied as described above, the resistance state is also changed at the interface 18 of the second electrode 14 with respect to the oxide semiconductor 12, and this mode of change is reversed from that for the interface 17 of the first electrode 3. Accordingly, even when the resistance state is changed at each of the interfaces 17 and 18, one of the interfaces 17 and 18 always has a high resistance state. Therefore, the leakage current problem of an excessive current flowing between the first and second electrodes 13 and 14 induced by the control voltage from the power supply 19 for control, and further, a current flowing between the second and third electrodes 14 and 15 can prevent from being caused with more certainty.

As described above, the resistive switching memory device 11 can achieve a device for switching a resistance or impedance or a memory device without the need for any FET or the like, while being based on diode characteristics with a rectifying property. More specifically, a device can be achieved which has functions such as the ability for the control voltage to substantially change the resistance efficiently and simply, and the ability to hold the resistance state even when the control voltage is removed.

While the resistive switching memory device 11 shown in FIG. 1 has a capacitor structure of metal/oxide semiconductor/metal, a planar structure may be adopted in which the first to third electrodes are formed next to each other on one principal surface of the oxide semiconductor.

Figure 4:
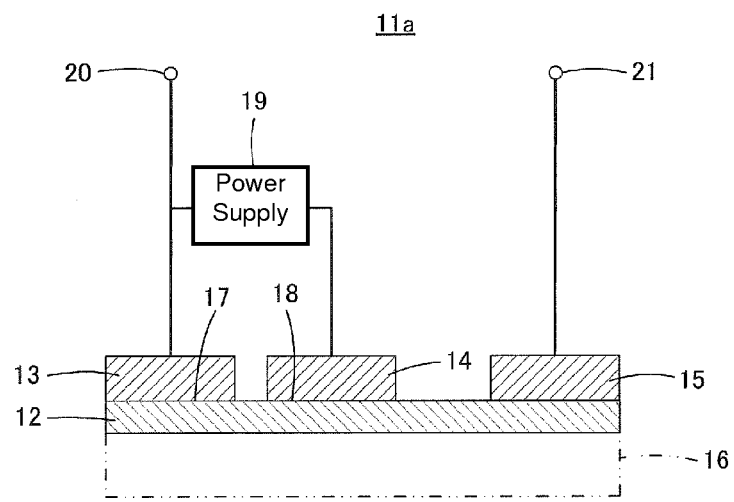
FIG. 4 is a cross-sectional view schematically illustrating a resistive switching memory device according to a second embodiment of the present invention.

FIG. 4 shows a planar resistive switching memory device 11a. In FIG. 4, the elements corresponding to the elements shown in FIG. 1 are denoted by like reference numerals, and the repeated descriptions of the elements will be omitted.

In the planar resistive switching memory device 11a shown in FIG. 4, first to third electrodes 13 to 15 are formed next to each other on one principal surface of an oxide semiconductor 12.

In the case of forming the oxide semiconductor 12 in the form of a thin film on an insulating substrate 16 for the planar resistive switching memory device 11a shown in FIG. 4, even when a relatively inexpensive MgO or LaAlO$_3$ insulator single-crystal substrate is used as the insulating substrate 16, it is possible to form thereon a high-quality oxide semiconductor 12 in the form of a thin film.

In addition, because the third electrode 15 is formed on the same surface as with the first and second electrodes 13 and 14, the step of forming the third electrode 15 can be carried out continuously from the step of forming the first and second electrodes 13 and 14.

Figure 5:
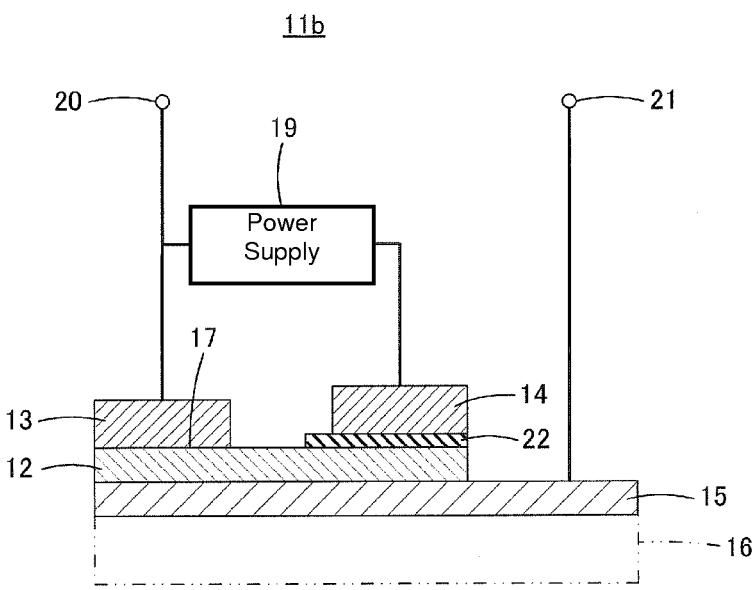
FIG. 5 is a cross-sectional view schematically illustrating a resistive switching memory device according to a third embodiment of the present invention.
Figure 6:
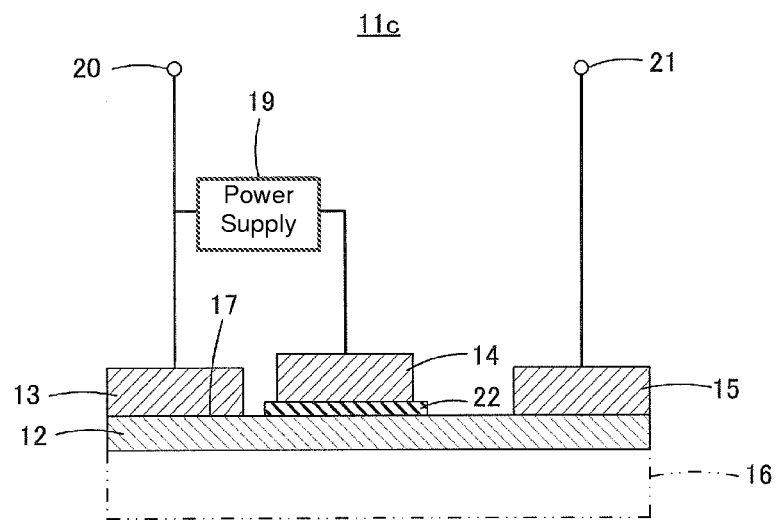
FIG. 6 is a cross-sectional view schematically illustrating a resistive switching memory device according to a fourth embodiment of the present invention.

While the second electrode 14 is also made of a material which can form a Schottky barrier in an interface region between the second electrode 14 and the oxide semiconductor 12 in the resistive switching memory device 11 or 11a described above, an insulating layer may be formed instead along the interface between the second electrode and the oxide semiconductor as in an embodiment shown in FIG. 5 or 6. FIGS. 5 and 6 respectively correspond to FIGS. 1 and 4, and in FIGS. 5 and 6, the elements corresponding to the elements shown in FIGS. 1 and 4 are respectively denoted by like reference numerals, and the repeated descriptions of the elements will be omitted.

In the resistive switching memory device 11b shown in FIG. 5, a second electrode 14 is formed over an oxide semiconductor 12 with an insulating layer 22 interposed therebetween. Likewise, in the resistive switching memory device 11c shown in FIG. 6, a second electrode 14 is formed over an oxide semiconductor 12 with an insulating layer 22 interposed therebetween.

Figure 7:
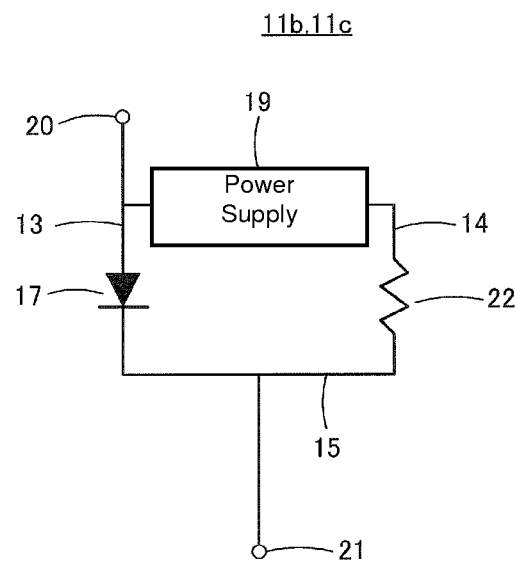
FIG. 7 is a circuit diagram schematically illustrating the resistive switching memory device shown in FIG. 5 or 6.

FIG. 7 is a circuit diagram schematically illustrating the resistive switching memory device 11b or 11c shown in FIG. 5 or 6. In FIG. 7, the elements corresponding to the elements shown in FIG. 5 or 6 are denoted by like reference numerals, for making the correspondence relationship between FIG. 5 or 6 and FIG. 7 easy to understand.

In the resistive switching memory devices 11, 11a, 11b, and 11c as described above, the junction interface 17 entirely develops the phenomenon of resistance change, and it is thus easy to design the resistance value in terms of the area of the electrode 13. In addition, the interface 17 has high uniformity, and it is thus possible to achieve a stable change in resistance or impedance.

In contrast, the bulky resistive switching memory device described previously requires a sandwich structure of electrode/oxide semiconductor/electrode, and forms a filamentary conduction path in the oxide semiconductor between the electrodes to undergo a change by connecting and cutting the filament. Therefore, the resistance value will vary depending on the conditions (size, number, and the like) of the filament, resulting in difficulty with resistance control. In addition, the bulky resistive switching memory device has no rectifying property, and thus needs to be connected to a diode, a transistor, or the like separately in order to limit the current in one direction.

Experimental examples will be described below which were carried out for confirming the advantageous effects of the present invention.

Figure 8:
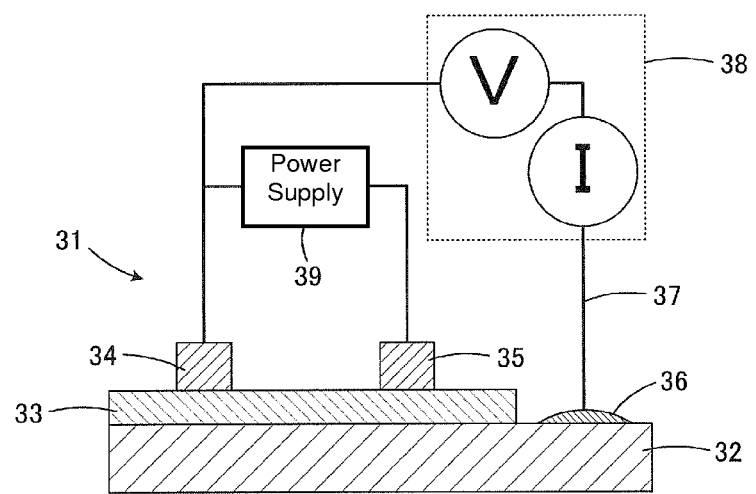
FIG. 8 is a cross-sectional view schematically illustrating a resistive switching memory device prepared in an experimental example.

FIG. 8 is a cross-sectional view schematically illustrating a resistive switching memory device 31 prepared as a sample for evaluation in an experimental example. A resistive switching memory device 31 has a structure provided with a third electrode 32 that includes a Nb: rTiO₃ (100) conductive substrate, with an oxide semiconductor 33 of a thin film formed thereon, and first and second electrodes 34 and 35 formed on the oxide semiconductor 33.

Experimental Example 1

The resistive switching memory device 31 having such a structure was prepared in accordance with the following steps in Experimental Example 1.

A ceramic target for obtaining the oxide semiconductor 33 was prepared as follows. First, with the use of respective powders of high-purity $BaCO_3$, $TiO_2$, and $Co_3O_4$ as raw materials, the powders were weighed so as to provide a predetermined composition, and then mixed for adequate mixing in an agate mortar with the addition of ethanol. Next, the powders were subjected to drying, followed by the addition of a binder, and to firing and then shape forming with the use of a high-pressure press and a mold so as to provide a diameter of about 20 mm and a thickness of about 5 mm. This compact was subjected to degreasing, and then to firing in the air for 4 hours at a temperature of 1300° C., thereby providing a target of Co (0.5 at %)-doped $BaTiO_3$.

On the other hand, Nb (0.5 at %)-doped $SrTiO_3$ (100) single-crystal substrate (manufactured by Furuuchi Chemical Corporation) was prepared to serve as the third electrodes 32.

Next, the target was used to create a Co (0.5 at %)-doped $BaTiO_3$ thin film on the order of 100 nm in film thickness to serve as the oxide semiconductor 33 on the substrate to serve as the third electrode 32 by a PLD (Pulse Laser Deposition) method. In this case, with the use of an ArF excimer laser from Lambda Physics "Compex 110" as the laser, generated laser light was collected and made incident into the target to create the thin film. The conditions for the laser during the deposition were set to energy of 1 J/cm², a frequency of 10 Hz, a temperature of 750° C., and the degree of vacuum of $1 \times 10^{-4}$ Torr ($O_2$ flowing).

Next, the first and second electrodes 34 and 35 made of Pt with a diameter of 300 μm were formed on the thin film by a DC sputtering method with the use of a metal mask.

For the resistive switching memory device 31 according to the thus obtained sample, as shown in FIG. 8, an extraction electrode 36 made of In—Ga was formed on the third electrode 32, and a current voltage generator 38 was connected between the extraction electrode 36 and the first electrode 34 while bringing a W probe 37 into contact with the extraction electrode 36 to evaluate the current-voltage characteristics between the first and third electrodes 34 and 32. A current voltage generator "R6246" from Advantest Corporation was used as the current voltage generator 38.

Figure 9:
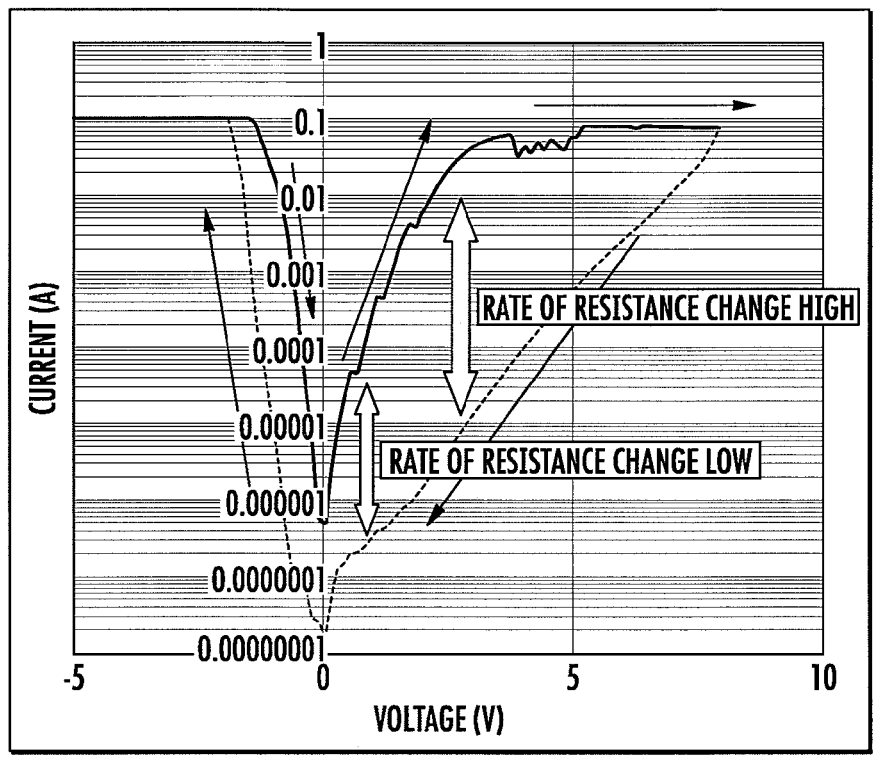
FIG. 9 is a diagram showing current-voltage characteristics between first and third electrodes of the resistive switching memory device shown in FIG. 8, prepared in Experimental Example 1.

FIG. 9 shows the current-voltage characteristics between the first and third electrodes 34 and 32.

As can be seen from FIG. 9, the resistive switching memory device 31 can achieve a rectifying property derived from a Schottky barrier formed at the interface between the first electrode 34 and the oxide semiconductor 33, and achieve significant resistance change characteristics. Therefore, the resistance value between the first and third electrodes 34 and 32 can be changed by applying a control voltage such as a voltage pulse between the first and second electrodes 34 and 35.

For changing the resistance value as described above, if there is no second electrode 35, it is necessary to disconnect the current line or signal line once between the first and third electrodes 34 and 32, because the control voltage has to be applied between the first and third electrodes 34 and 32 in the case of applying the control voltage for changing the resistance. Thus, the control of the device will be complicated.

In addition, as can be seen from FIG. 9, the highest rate of resistance change can be achieved at on the order of 3 to 4V, and at a bias voltage of, for example, 1 V between the first and third electrodes 34 and 32, only a smaller difference in resistance can be achieved.

Figure 10:
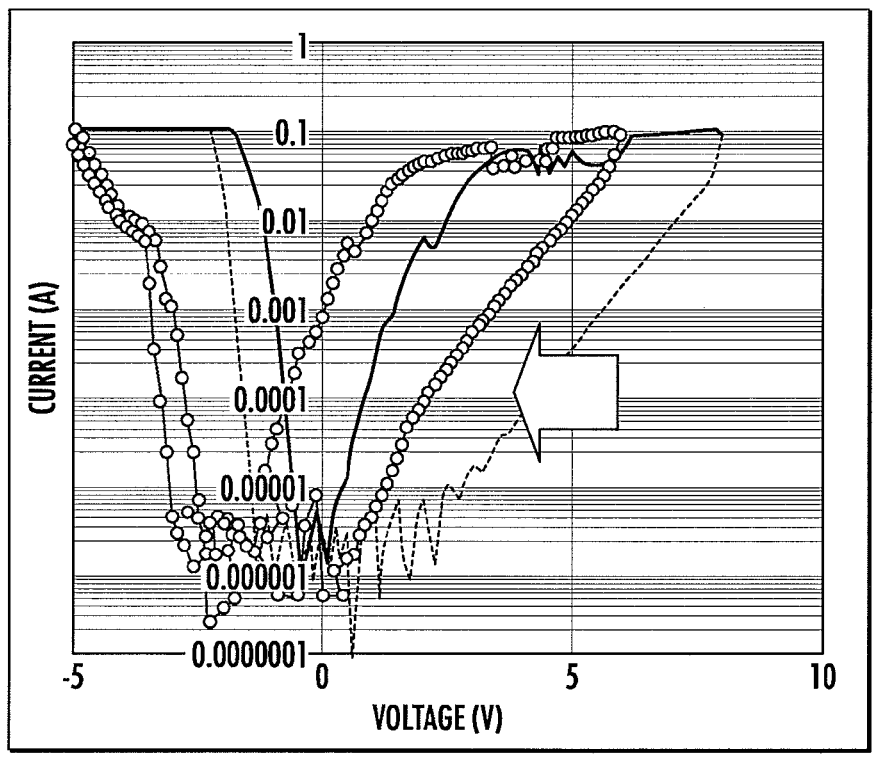
FIG. 10 is a diagram showing current-voltage characteristics between the first and third electrodes of the resistive switching memory device shown in FIG. 8, prepared in Experimental Example 1, for comparing a case of applying no voltage between the first and second electrodes with a case of applying a voltage therebetween.

In the case of the resistive switching memory device 31 to serve as a sample, the newly added second electrode 35 is utilized to connect the power supply 39 for control between the first and second electrodes 34 and 35, and add a control bias from the power supply 39 for control, thereby allowing the current-voltage characteristics to be shifted in the direction indicated by an arrow while keeping a high rate of resistance change, as shown in FIG. 10. Accordingly, a desired rate of resistance change or resistance value can be easily achieved between the first and third electrodes 34 and 32 by arbitrarily changing the control bias.

It is to be noted that in FIG. 10, the characteristics in the case of applying no control bias are indicated by a heavy line without ○, whereas the characteristics in the case of applying a control bias of +2 V are indicated by a heavy line with ○ distributed.

Table 1 shows the resistance between the first and third electrodes 34 and 32, that is, the resistance between input and output terminals, which is estimated from FIG. 10, in the case of using no control voltage and the case of using the control voltage.

TABLE 1

| | | Input-Output Terminal Voltage | | | |
| | | 1 V | | 3 V | |
| Control Voltage | Resistance State | Resistance (Ω) | Rate of Resistance Change (%) | Resistance (Ω) | Rate of Resistance Change (%) |
|---|---|---|---|---|---|
| 0 V | LRS | 5000 | 44150 | 113 | 233200 |
| | HRS | 2212000 | | 263620 | |
| +2 V | LRS | 84 | 211400 | | |
| | HRS | 177847 | | | |

As is clear from Table 1, a large difference in resistance can be achieved even in the case of using no control voltage (0 V), while a substantial difference is made between, and the resistance value also varies between 1 V and 3 V for the voltage between the input and output terminals. In contrast, the use of the control voltage (+2 V) makes it possible to control the resistance between the input and output terminals and the rate of resistance change, and for example, when a large difference in resistance is desired, the control voltage can be used for the control so as to achieve the difference. Furthermore, for example, in the case of current-voltage characteristics as shown in FIG. 10, the rates of resistance change measured at 1 V and 3 V were calculated on the basis of the formula:

Rate of Resistance Change [%]=(Resistance Value in High Resistance State−Resistance Value in Low Resistance State)/Resistance Value in Low Resistance State×100.

The results are shown in the column "Rate of Resistance Change" of Table 1.

It is to be noted that in the "Resistance State" of Table 1, "LRS" indicates a low resistance state, and "HRS" indicates a high resistance state. These indications are also used in the drawings, etc. described below.

Figure 11:
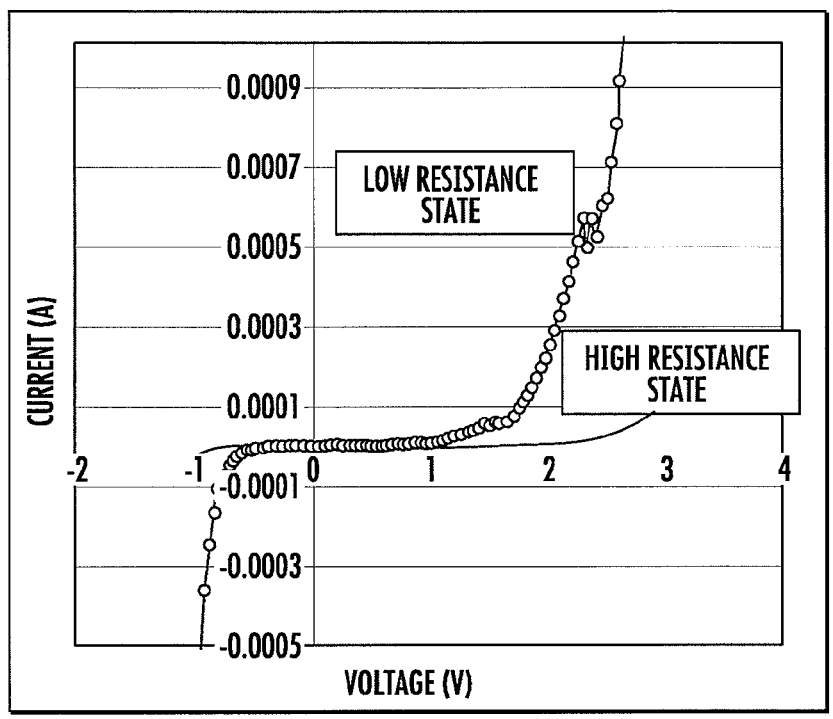
FIG. 11 is a diagram showing current-voltage characteristics between the first and third electrodes of the resistive switching memory device shown in FIG. 8, prepared in Experimental Example 1, for showing each case of a low resistance state and a high resistance state.

FIG. 11 shows current-voltage characteristics between the first and third electrodes 34 and 32 in the case of changing the resistance at the interface between the first electrode 34 and the oxide semiconductor 33 by applying a voltage pulse between the first and second electrodes 34 and 35, without applying a voltage pulse for controlling the resistance state between the first and third electrodes 34 and 32. In FIG. 11, the current-voltage characteristics in a high resistance state are indicated by a heavy line without ○, whereas the current-voltage characteristics in a low resistance state are indicated by a heavy line with ○ distributed.

As can be seen from FIG. 11, even without applying the voltage pulse for controlling the resistance state between the first and third electrodes 34 and 32, the use of the second electrode 35 makes it possible to change the resistance between the first and third electrodes 34 and 32. More specifically, the application of the control voltage between the first and second electrodes 34 and 35 can change the resistance value or impedance value between the first and third electrodes 34 and 32.

In Experimental Example 1, the Co (0.5 at %)-doped $BaTiO_3$ thin film was used as the oxide semiconductor 33, and next, the resistance holding characteristics (memory characteristics) were evaluated in this case. As a result, it has been determined that the resistance holding characteristics have a drawback, in particular, have the problem of the inability to hold the low resistance state for a long period of time. It has been determined that the same applies to the case of using a $SrTiO_3$ thin film instead of the $BaTiO_3$ thin film.

More specifically, at room temperature, the resistance in the high resistance state undergoes very little change even with the passage of time, whereas the resistance in the low resistance state has a tendency to increase gradually with time. This phenomenon becomes more remarkable as the temperature is increased, and it has been determined that the resistance value in the low resistance state becomes nearly equal to the resistance value in the high resistance state after a lapse of 24 hours, for example, at 100° C. More specifically, it has been determined that it is not possible to hold the low resistance state for a long period of time.

It is to be noted that this problem can be solved tentatively in the following way. More specifically, the resistive switching memory device 31 according to the sample includes the second electrode 25 for applying the control voltage in addition to the first and third electrodes 34 and 32 for input and output, and thus can easily carry out "refresh" (writing a stored state again).

However, this solution is also not preferable in terms of controllability and reduction in power consumption, which is not able to be regarded as a fundamental solution.

For the fundamental solution, there is a need to use an oxide semiconductor which is excellent in terms of resistance holding characteristics. Experimental Examples 2 and 3 described below respectively use a $(Ba,Sr)TiO_3$ based oxide semiconductor and a $TiO_2$ based oxide semiconductor with an added transition metal capable of forming a level at an interface or in a bulk, which are oxide semiconductors excellent in terms of resistance holding characteristics.

Experimental Example 2

In order to form the oxide semiconductor 33, a ceramic target (diameter: 20 mm, thickness: 5 mm) represented by the general formula: $(Ba_{1-x}Sr_x)Ti_{1-y}M_yO_3$ (M is any of Mn, Co, and Fe) was prepared by a solid phase reaction method. With the use of, as raw materials, respective powders of high-purity $SrCO_3$, $BaCO_3$, $TiO_2$, $Mn_3O_4$, $Co_3O_4$, and $Fe_2O_3$, the powders were weighed so as to provide the predetermined compositions shown in Tables 2 to 6, and then mixed for adequate mixing in an agate mortar with the addition of ethanol. Next, the powders were subjected to drying, followed by the addition of a binder, and to firing and then shape forming with the use of a high-pressure press and a mold so as to provide a diameter of about 20 mm and a thickness of about mm. The compacts were subjected to degreasing, and then to firing in the air for 4 hours at a temperature of 1300° C., thereby providing targets.

On the other hand, a Nb (0.5 at %) doped $SrTiO_3$ (100) single-crystal substrate (manufactured by Furuuchi Chemical Corporation) was prepared to serve as a third electrode 32 for providing a nearly ohmic contact with a $(Ba,Sr)TiO_3$ based thin film to serve as the oxide semiconductor 33.

Next, the target was used to create, on the substrate to serve as the third electrode 32, a $(Ba,Sr)TiO_3$ based thin film to serve as the oxide semiconductor 33 on the order of 100 nm in film thickness by a PLD method. In this case, with the use of an ArF excimer laser "Compex 110" manufactured by Lambda Physics as the laser, generated laser light was collected and made incident into the target to create the thin film. The conditions for the laser during the deposition were set to energy of 1 J/cm², a frequency of 10 Hz, a temperature of 750° C., and the degree of vacuum of $1\times10^{-4}$ Torr ($O_2$ flowing).

Next, the first and second electrodes 34 and 35 made of Pt with a diameter of 300 μm were formed on the thin film to serve as the oxide semiconductor 33 by a DC sputtering method with the use of a metal mask.

For the resistive switching memory device 31 according to the thus obtained sample, as shown in FIG. 8, an extraction electrode 36 made of In—Ga was formed on the third electrode 32, and a current voltage generator 38 was connected between the extraction electrode 36 and the first electrode 34 while bringing a W probe 37 into contact with the extraction electrode 36 to evaluate the current-voltage characteristics and evaluate the resistance holding characteristics at room temperature and 100° C. A current voltage generator "R6246A" manufactured by Advantest Corporation was used as a current voltage generator 7.

For the evaluation of current-voltage characteristics, the current flowing between the first and third electrodes 34 and 32 of the resistive switching memory device 31 was measured while sweeping the voltage applied between the first and third electrodes 34 and 32 of the resistive switching memory device 31 in such a way as $-X(V) \Rightarrow 0V \Rightarrow Y(V) \Rightarrow 0V \Rightarrow -X(V)$ (X and Y are any voltage values). Then, for example, in the current-voltage characteristics as shown in FIG. 9, the voltage at which the largest change is achieved with the polarity of switching from a low resistance state to a high resistance state was regarded as an "estimated voltage", and the rate of resistance change at the "estimated voltage" was calculated on the basis of the formula:

Rate of Resistance Change [%]=(Resistance Value in High Resistance State−Resistance Value in Low Resistance State)/Resistance Value in Low Resistance State×100.

The results are shown in the columns "Rate of Resistance Change" of Tables 2 to 6.

Figure 12:
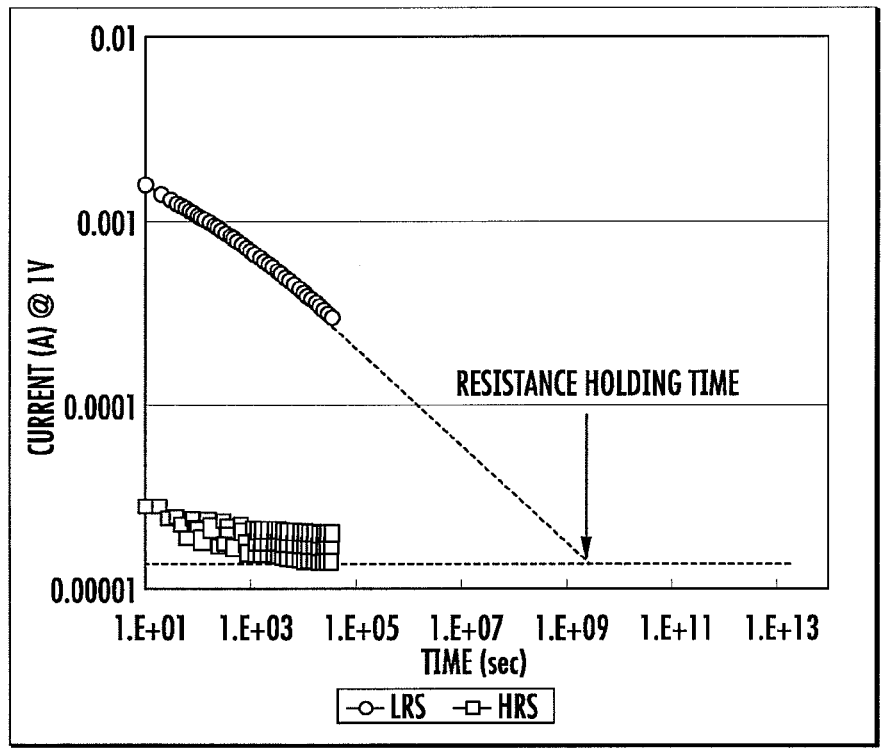
FIG. 12 is a diagram for explaining how to obtain the resistance holding time for a resistive switching memory device evaluated in Experimental Example 2.

In addition, for the evaluation of resistance holding characteristics, the resistance was measured at a voltage of 1 V every 10 seconds for 10 hours after switching to each of a high resistance state and a low resistance state, and the change in the resistance with time was measured at a temperature of 100° C. to evaluate the stability of the resistance. More specifically, as shown in FIG. 12 as an example, a straight line was drawn from each of logarithmic plots (Log vs. Log) of resistance value (current value) vs. time, the time of the resistance value in the low resistance state in agreement with the resistance value in the high resistance state was defined as resistance holding time, and this resistance holding time was obtained.

The evaluation results of the resistance holding time on the basis of the resistance values measured at 100° C. are shown in the columns "Resistance Holding Characteristics" of Tables 2 to 6. More specifically, when the resistance holding time was greater than 24 hours, the sample was determined as a favorable product, and the indication "Over 24 h" was shown in the column "Resistance Holding Characteristics". On the other hand, when the resistance holding time was 24 hours or less, the sample was determined as a defective, and the mark "x" was shown in the column.

It is to be noted that the resistance holding time obtained in the way described above is absolutely intended to monitor the trend of the resistive memory effect, not to indicate the actual resistive memory effect time, and considered as a sufficient evaluation factor for relative comparison.

TABLE 2

| Sample Number | $BaTi_{1-y}M_yO_3$ | | Rate of Resistance Change (%) | Resistance Holding Characteristics @100° C. |
|---|---|---|---|---|
| | Additive Element (M) | Additive Amount (y) | | |
| 1 | — | 0 | 290000 | X |
| 2 | Mn | 0.005 | 115500 | Over 24 h |
| 3 | Mn | 0.01 | 87000 | Over 24 h |
| 4 | Mn | 0.05 | 92100 | Over 24 h |
| 5 | Co | 0.005 | 88000 | Over 24 h |
| 6 | Co | 0.01 | 111000 | Over 24 h |
| 7 | Co | 0.05 | 78500 | Over 24 h |
| 8 | Fe | 0.005 | 56800 | Over 24 h |
| 9 | Fe | 0.01 | 74700 | Over 24 h |
| 10 | Fe | 0.05 | 36500 | Over 24 h |

The samples shown in Table 2 satisfy the condition of x=0, that is, Sr/Ba=0/1.0 in $(Ba_{1-x}Sr_x)Ti_{1-y}M_yO_3$.

TABLE 3

| Sample Number | $Sr_{0.75}Ba_{0.25}Ti_{1-y}M_yO_3$ | | Rate of Resistance Change (%) | Resistance Holding Characteristics @100° C. |
|---|---|---|---|---|
| | Additive Element (M) | Additive Amount (y) | | |
| 11 | Mn | 0.005 | 137000 | Over 24 h |
| 12 | Mn | 0.01 | 99100 | Over 24 h |
| 13 | Mn | 0.05 | 86700 | Over 24 h |
| 14 | Co | 0.005 | 84800 | Over 24 h |
| 15 | Co | 0.01 | 100100 | Over 24 h |
| 16 | Co | 0.05 | 75400 | Over 24 h |
| 17 | Fe | 0.005 | 67500 | Over 24 h |
| 18 | Fe | 0.01 | 81900 | Over 24 h |
| 19 | Fe | 0.05 | 41600 | Over 24 h |

The samples shown in Table 3 satisfy the condition of x=0.75, that is, Sr/Ba=0.75/0.25 in $(Ba_{1-x}Sr_x)Ti_{1-y}M_yO_3$.

TABLE 4

| Sample Number | $Sr_{0.5}Ba_{0.5}Ti_{1-y}M_yO_3$ | | Rate of Resistance Change (%) | Resistance Holding Characteristics @100° C. |
|---|---|---|---|---|
| | Additive Element (M) | Additive Amount (y) | | |
| 20 | Mn | 0.005 | 100500 | Over 24 h |
| 21 | Mn | 0.01 | 78500 | Over 24 h |
| 22 | Mn | 0.05 | 95400 | Over 24 h |
| 23 | Co | 0.005 | 80800 | Over 24 h |
| 24 | Co | 0.01 | 111000 | Over 24 h |
| 25 | Co | 0.05 | 77500 | Over 24 h |
| 26 | Fe | 0.005 | 75700 | Over 24 h |
| 27 | Fe | 0.01 | 78500 | Over 24 h |
| 28 | Fe | 0.05 | 33300 | Over 24 h |

The samples shown in Table 4 satisfy the condition of x=0.5, that is, Sr/Ba=0.5/0.5 in $(Ba_{1-x}Sr_x)Ti_{1-y}M_yO_3$.

TABLE 5

| Sample Number | $Sr_{0.25}Ba_{0.75}Ti_{1-y}M_yO_3$ | | Rate of Resistance Change (%) | Resistance Holding Characteristics @100° C. |
|---|---|---|---|---|
| | Additive Element (M) | Additive Amount (y) | | |
| 29 | Mn | 0.005 | 108500 | Over 24 h |
| 30 | Mn | 0.01 | 100400 | Over 24 h |
| 31 | Mn | 0.05 | 78500 | Over 24 h |
| 32 | Co | 0.005 | 84100 | Over 24 h |
| 33 | Co | 0.01 | 95900 | Over 24 h |
| 34 | Co | 0.05 | 80900 | Over 24 h |
| 35 | Fe | 0.005 | 75600 | Over 24 h |
| 36 | Fe | 0.01 | 84500 | Over 24 h |
| 37 | Fe | 0.05 | 41900 | Over 24 h |

The samples shown in Table 5 satisfy the condition of x=0.25, that is, Sr/Ba=0.25/0.75 in $(Ba_{1-x}Sr_x)Ti_{1-y}M_yO_3$.

TABLE 6

| Sample Number | $SrTi_{1-y}M_yO_3$ | | Rate of Resistance Change (%) | Resistance Holding Characteristics @100° C. |
|---|---|---|---|---|
| | Additive Element (M) | Additive Amount (y) | | |
| 38 | Mn | 0.005 | 136000 | Over 24 h |
| 39 | Mn | 0.01 | 77800 | Over 24 h |
| 40 | Mn | 0.05 | 89000 | Over 24 h |
| 41 | Co | 0.005 | 123000 | Over 24 h |
| 42 | Co | 0.01 | 100500 | Over 24 h |
| 43 | Co | 0.05 | 89800 | Over 24 h |
| 44 | Fe | 0.005 | 76500 | Over 24 h |
| 45 | Fe | 0.01 | 69100 | Over 24 h |
| 46 | Fe | 0.05 | 39200 | Over 24 h |

The samples shown in Table 6 satisfy the condition of x=1, that is, Sr/Ba=1.0/0 in $(Ba_{1-x}Sr_x)Ti_{1-y}M_yO_3$.

As can be seen from Tables 2 to 6, sample 1 including the (Ba, Sr) $TiO_3$ thin film with no transition metal added provided a high rate of resistance change of 10000% or more, such as 290000%, but provided inferior resistance holding characteristics.

In contrast, it has been determined that samples 2 to 46 including the $(Ba_{1-x}Sr_x)Ti_{1-y}M_yO_3$ thin film with any of Mn, Co, and Fe added as the transition metal, that is, the additive element M, and satisfying the condition of y 0.05 can achieve excellent resistance changes and resistance holding characteristics, such as 10000% or more indicated for the rate of resistance change, and the resistance holding time over 24 hours at 100° C.

Experimental Example 3

In Experimental Example 3, ceramic targets represented by the general formula: $Ti_{1-x}M_xO_2$ (M is any of Co, Fe, Ni, and Cu) with the predetermined compositions shown in Table 7 were prepared, and used to form the oxide semiconductor 33.

Except that the firing temperature for obtaining the targets was set to 1100° C., and the conditions for the laser in the formation of $Ti_{1-x}M_xO_2$ thin films with the use of the targets were set to a temperature of 600° C. and the degree of vacuum of 0.1 Torr ($O_2$ flowing), resistive switching memory devices 31 according to samples were prepared under the same conditions as in the case of Experimental Example 2, and evaluated for current-voltage characteristics and for resistance holding characteristics at room temperature and 100° C. The results are shown in Table 7. It is to be noted that for the resistance holding characteristics, Table 7 shows only the resistance holding characteristics at 100° C.

TABLE 7

| | $Ti_{1-x}M_xO_2$ | | Rate of | Resistance Holding |
|---|---|---|---|---|
| Sample Number | Additive Element (M) | Additive Amount (x) | Resistance Change (%) | Characteristics @100° C. |
| 47 | Co | 0.005 | 48000 | Over 24 h |
| 48 | Co | 0.01 | 100000 | Over 24 h |
| 49 | Co | 0.05 | 32000 | Over 24 h |
| 50 | Fe | 0.005 | 35000 | Over 24 h |
| 51 | Fe | 0.01 | 28000 | Over 24 h |
| 52 | Fe | 0.05 | 30500 | Over 24 h |
| 53 | Ni | 0.005 | 8900 | Over 24 h |
| 54 | Ni | 0.01 | 9100 | Over 24 h |
| 55 | Ni | 0.05 | 7500 | Over 24 h |
| 56 | Cu | 0.005 | 6800 | Over 24 h |
| 57 | Cu | 0.01 | 8050 | Over 24 h |
| 58 | Cu | 0.05 | 7900 | Over 24 h |

As can be seen from Table 7, samples 47 to 58 including the $TiO_2$ thin film with any of Co, Fe, Ni, and Cu added as the transition metal in the range satisfying the condition of $0.005 \leq x \leq 0.05$ provided 6800% or more for the rate of resistance change. In particular, samples 47 to 52 with Co or Fe added as the transition metal succeeded in the achievement of an extremely high rate of resistance change greater than 10000%.

Figure 13:
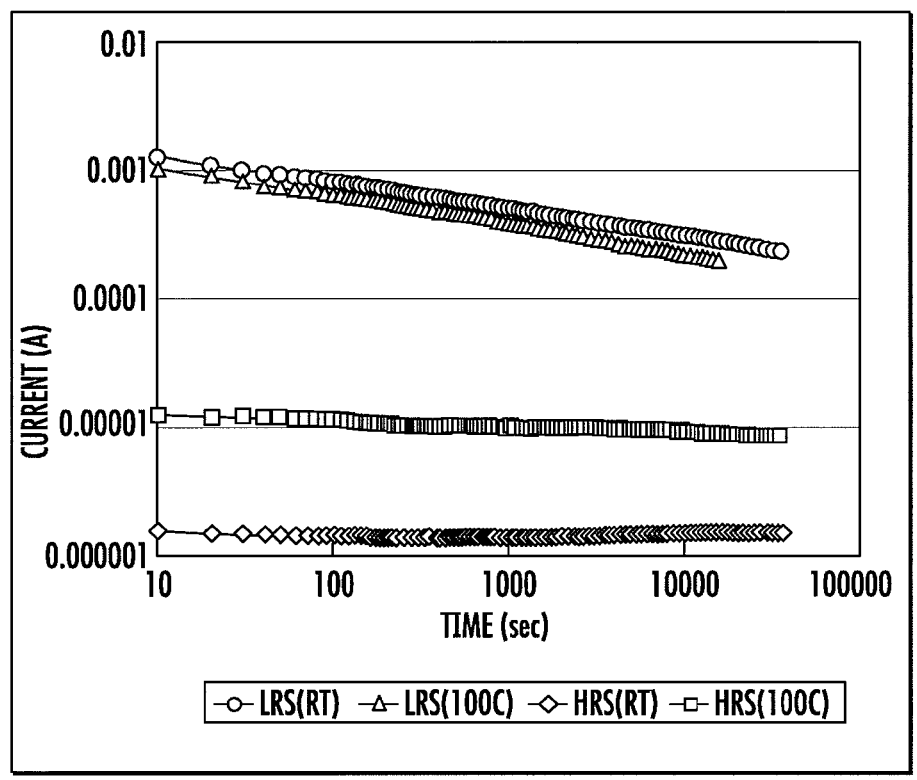
FIG. 13 is a diagram showing resistance holding characteristics for a resistive memory device according to sample 48 prepared in Experimental Example 2.
Figure 14:
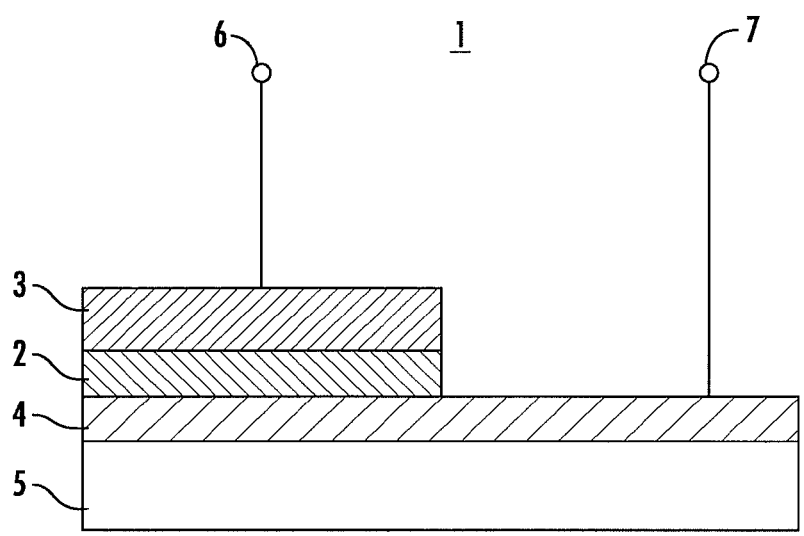
FIG. 14 is a cross-sectional view schematically illustrating a resistive switching memory device of interest to the present invention.

In addition, for the resistance holding time, the samples achieved excellent resistance holding characteristics, such as resistance holding time over 24 hours at 100° C. As shown in FIG. 13, for example, as for sample 48, while the resistance value in the low resistance state has a tendency to change with the passage of time, the sample succeeded in the achievement of extremely long resistance holding time even at 100° C.

The resistive switching memory devices prepared in Experimental Examples 1 to 3 provide high rates of resistance change as described previously, and can be thus applied advantageously as, for example, impedance switching elements. An embodiment will be described below in the case of using the resistive switching memory device according to the present invention as an impedance switching device.

Typically, a PIN diode type switching element or a FET transistor type switching element is used as a switching element of a RF signal circuit.

In the case of the PIN diode type switching element, the ON/OFF of the RF signal circuit is achieved in such a way that the low resistance state during the application of a forward bias is used as an ON state, whereas the high resistance state during the application of a reverse bias is used as an OFF state.

On the other hand, in the case of the FET transistor type switch, the ON/OFF of the RF signal circuit is achieved in such a way that the low resistance state during the application of a gate voltage is used an ON state, whereas the high resistance state during no application of the gate voltage is used as an OFF state.

However, in the case of the PIN diode type switching element, it is necessary to apply a voltage in the forward direction of the PIN diode in order to bring the element into the ON state, and continue to apply the voltage in the forward direction in order to keep the ON state, and the PIN diode type switching element has the problem of extremely high power consumption resulting from significantly large amounts of current flowing, because this state corresponds to the low resistance state.

On the other hand, in the case of the FET transistor type switching element, the power consumption is low because large amounts of current never flow through the gate even during the application of the gate voltage. However, the FET transistor type switching element has the problem of the need to continue to apply the gate voltage in order to keep the ON state. In addition, the FET transistor type switching element also has the problem of higher cost because of its complex structure, as compared with the case of the PIN diode type switching element.

In contrast to these elements, in the case of using the resistive switching memory device as a Schottky junction device according to the present invention, it is possible to change the impedance at the same time with the change in resistance, and the resistive switching memory device can be used as an impedance switching device as in the case of the PIN diode. Furthermore, the resistive switching memory device according to the present invention has the resistive memory function, and there is thus no need to continue to apply any voltage after switching to the low resistance state, thereby allowing the power consumption to be reduced. Therefore, it is possible to solve the problem of power consumption, which is a drawback of the PIN diode type, and the problem of the need to continue to apply a voltage in order to keep the ON state, which is a drawback of both the PIN diode type and the FET transistor type.

Hereinafter, the following experiment was carried out for confirming that the resistive switching memory device according to the present invention can achieve an excellent impedance switching device.

Experimental Example 4

In Experimental Example 4, for samples 2 to 58 prepared in Experimental Examples 2 and 3, evaluations were made on impedance frequency characteristics in the high resistance state and the low resistance state.

In this evaluation test, with the use of the same current voltage generator 38 as in the case of Experimental Examples 2 and 3, a voltage pulse was applied between the first and second electrodes 34 and 35 of the resistive switching memory devices 31 according to the samples to switch the resistance state to each of the high resistance state and the low resistance state, and then, after a lapse of 1 hour, with the use of an LCR meter ("HP4284" manufactured by Hewlett-Packard Company), the evaluations of impedance frequency characteristics were made in the frequency band of 100 Hz to 1 MHz. Then, the impedance in the high resistance state and the impedance in the low resistance state were each obtained at 1 kHz from the obtained frequency characteristics, and the rate of impedance change was calculated on the basis of the formula:

Rate of Impedance Change [%]=(Impedance in High Resistance State−Impedance in Low Resistance State)/Impedance in Low State×100.

The results are shown in Table 8.

TABLE 8

| Sample Number | Rate of Impedance Change (%) @1 kHz |
|---|---|
| 2 | 4950 |
| 3 | 4300 |
| 4 | 5010 |
| 5 | 4250 |
| 6 | 5005 |
| 7 | 4005 |
| 8 | 3950 |
| 9 | 4500 |
| 10 | 3560 |
| 11 | 5200 |
| 12 | 4810 |
| 13 | 4440 |
| 14 | 4150 |
| 15 | 5000 |
| 16 | 4560 |
| 17 | 3950 |
| 18 | 4190 |
| 19 | 3580 |
| 20 | 5700 |
| 21 | 4250 |
| 22 | 4720 |
| 23 | 4010 |
| 24 | 4710 |
| 25 | 3860 |
| 26 | 3950 |
| 27 | 4220 |
| 28 | 3770 |
| 29 | 4910 |
| 30 | 4760 |
| 31 | 3950 |
| 32 | 4250 |
| 33 | 4460 |
| 34 | 4090 |
| 35 | 3900 |
| 36 | 4220 |
| 37 | 3860 |
| 38 | 3950 |
| 39 | 4100 |
| 40 | 4210 |
| 41 | 5250 |
| 42 | 5500 |
| 43 | 4870 |
| 44 | 3500 |
| 45 | 3940 |
| 46 | 3250 |
| 47 | 5200 |
| 48 | 7750 |
| 49 | 5050 |
| 50 | 5700 |
| 51 | 5100 |
| 52 | 5200 |
| 53 | 3200 |
| 54 | 3680 |
| 55 | 3560 |
| 56 | 3050 |
| 57 | 3150 |
| 58 | 3100 |

As shown in Table 8, samples 2 to 58 succeeded in rates of impedance change greater than 3000%.

As described above, the resistive switching memory device according to the present invention allows not only the achievement of a high rate of resistance change and excellent resistive memory characteristics, but also the achievement of a high rate of impedance change, and can be thus used advantageously not only as a resistive memory device using the resistance change, but also as an impedance switching device.

DESCRIPTION OF REFERENCE SYMBOLS 11, 11a, 11b, 11c, 31 resistive switching memory device
12, 33 oxide semiconductor
13, 34 first electrode
14, 35 second electrode
15, 32 third electrode
17, 18 interface
19, 39 power supply for control
22 insulating layer

The invention claimed is:

1. A resistive switching memory device comprising:
an oxide semiconductor selected from the group consisting of $(Ba_{1-x}Sr_x)Ti_{1-y}A_yO_3$, $Ti_{1-z}M_zO_2$, and $(R,Ca)MnO_3$, wherein A is at least one of Mn, Fe, and Co; $0 \leq x \leq 1.0$ and $0.005 \leq y \leq 0.05$, M is at least one of Fe, Co, Ni, and Cu; and $0.005 \leq z \leq 0.05$, and R is any of La, Nd, Pr, Sm, Gd, Dy, Ho, and Y;
at least a first electrode, a second electrode, and a third electrode, each of the first, second and third electrodes being adjacent the oxide semiconductor; and
a power supply for control connected between the first electrode and the second electrode, wherein
the first electrode comprises a first material that forms a first Schottky barrier, the first Schottky barrier having a rectifying property and resistance change characteristics in a first interface region between the first electrode and the oxide semiconductor,
the second electrode comprises a second material that forms a second Schottky barrier, the second Schottky barrier having a rectifying property and resistance change characteristics in a second interface region between the second electrode and the oxide semiconductor,
the third electrode comprises a third material which forms a contact that is ohmic as compared to that of the first interface region and as compared to that of the second interface region, and
the power supply is configured to control a resistance of the first interface region.

2. The resistive switching memory device according to claim 1, wherein each of the first, second and third electrodes are in contact with the oxide semiconductor.

3. The resistive switching memory device according to claim 1, further comprising an insulating layer between the second electrode and the oxide semiconductor.

4. The resistive switching memory device according to claim 1, wherein the oxide semiconductor is an n-type semiconductor.

5. The resistive switching memory device according to claim 1, wherein the resistive switching memory device has a capacitor structure.

6. The resistive switching memory device according to claim 1, wherein the first and second electrodes are adjacent a first surface of the oxide semiconductor, and the third electrode is adjacent a second surface of the oxide semiconductor, the first surface and the second surface of the oxide semiconductor being opposed to each other.

7. The resistive switching memory device according to claim 6, further comprising an insulating substrate adjacent the third electrode.

8. The resistive switching memory device according to claim 1, wherein the first, second and third electrodes are adjacent a first surface of the oxide semiconductor.

9. The resistive switching memory device according to claim 8, further comprising an insulating substrate adjacent a second surface of the oxide semiconductor, the first surface and the second surface of the oxide semiconductor being opposed to each other.

10. The resistive switching memory device according to claim 1, wherein the oxide semiconductor is a p-type semiconductor.

* * * * *